United States Patent

Oyama

[11] Patent Number: 5,821,672
[45] Date of Patent: Oct. 13, 1998

[54] SURFACE MOUNTING TYPE ELECTRONIC DEVICE

[75] Inventor: Yuusei Oyama, Nagaokakyo, Japan

[73] Assignee: Murata Manufacturing Co., Ltd., Japan

[21] Appl. No.: 782,580

[22] Filed: Jan. 13, 1997

Related U.S. Application Data

[63] Continuation of Ser. No. 356,858, Dec. 15, 1994, abandoned.

[30] Foreign Application Priority Data

Dec. 15, 1993 [JP] Japan .................................. 5-314613

[51] Int. Cl.[6] .................................................. H01L 41/08
[52] U.S. Cl. .......................................... 310/344; 310/355
[58] Field of Search ..................... 310/344, 348, 310/351–356; 361/679, 772, 807–810

[56] References Cited

U.S. PATENT DOCUMENTS

| | | | |
|---|---|---|---|
| 2,416,876 | 3/1947 | Kuenstler | 310/344 X |
| 2,577,576 | 12/1951 | Glickman et al. | 310/344 |
| 3,697,789 | 10/1972 | Kato et al. | 310/344 |
| 4,223,177 | 9/1980 | Nakamura | 310/344 X |
| 5,265,316 | 11/1993 | Ikeda et al. | 310/344 X |
| 5,274,529 | 12/1993 | Mura et al. | 361/679 |

*Primary Examiner*—Mark O. Budd
*Attorney, Agent, or Firm*—Ostrolenk, Faber, Gerb & Soffen, LLP

[57] ABSTRACT

Surface mounting type electronic devices which have a lead terminal which protrudes its external connecting portion from one side of the housing. The surface mounting type electronic devices are, for example, surface mounting type piezoelectric devices such as ladder filters, surface mounting type oscillators and surface mounting type LC filters. On the opposite side of the housing, a dummy metal member for soldering is provided. The dummy metal member has a coming-off prevention. The dummy metal member is fixed to the housing by engaging the coming-off prevention with a locking portion of the housing.

39 Claims, 3 Drawing Sheets

F I G. 2
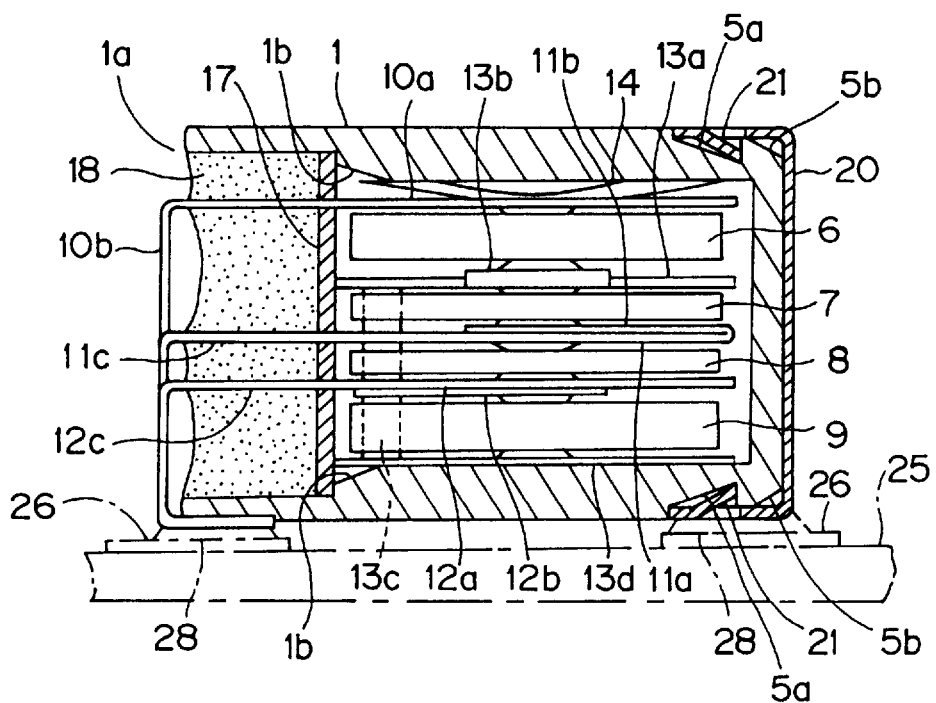
F I G. 3
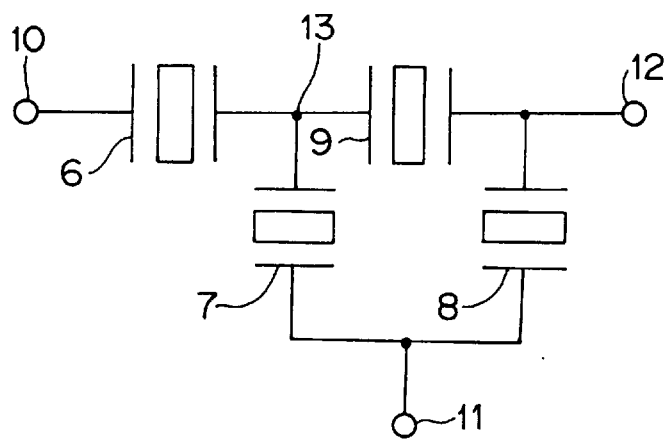

SURFACE MOUNTING TYPE ELECTRONIC DEVICE

This is a continuation of application Ser. No. 08/356,858 filed on Dec. 15, 1994, now abandoned.

BACKGROUND OF THE INVENTION

1. Field of the Invention

The present invention relates to electronic devices, and more particularly, to surface mounting type electronic devices for being surface-mounted on printed circuit boards or the like to form various electronic circuits.

2. Description of Related Art

A well-known type of surface mounting type electronic device is one having lead terminals with external connecting portions that protrude from one side of the housing. This type of electronic device gets out of position easily when it is soldered to a printed circuit board or the like. After the soldering, because of external stresses, cracks are apt to occur in the external connecting portions of the lead terminals, and the electronic device is apt to rise on the external connecting portions.

As a countermeasure against these problems, a dummy electrode for soldering is formed on the opposite side of the housing to the side having the protruded external connecting portions of the lead terminals. The dummy electrode is formed by coating of conductive paste and hardening thereof. However, the conductive paste coating and hardening are troublesome processes, and the conductive paste may stick on unnecessary portions. Further, the mechanical strength of the dummy electrode is weak.

As another countermeasure, a dummy metal member for soldering is provided on the opposite side of the housing to the side having the protruded external connecting portions of the lead terminals. The dummy metal member is fixed to the housing by adhesive. In this countermeasure, the troublesome processes of forming the dummy electrode can be eliminated, and the dummy metal member has a larger mechanical strength than the dummy electrode. However, even this countermeasure has problems that the adhesive may stick on unnecessary portions and that it is difficult to control the volume of the adhesive.

SUMMARY OF THE INVENTION

An object of the present invention is to provide a surface mounting type electronic device which does not require the use of adhesive to fix a dummy metal member for soldering to the housing.

In order to attain the object, a surface mounting type electronic device comprises: a housing which contains electronic elements, the housing having locking means on one side; a lead terminal having an external connecting portion that protrudes from the opposite side of the housing; and a dummy metal member for soldering, the dummy metal member having coming-off prevention means. The dummy metal member is fixed to the housing by engaging the coming-off prevention means with the locking means. The electronic elements contained in the housing are piezoresonators, resistor elements, inductor elements, capacitor elements or the like.

An electronic device of this structure, such as a ladder filter, is fixed on a printed circuit board by soldering the external connecting portions of the lead terminals and the dummy metal member to the printed circuit board. The dummy metal member is securely fixed to the housing because of the engagement between the coming-off prevention means and the locking means.

BRIEF DESCRIPTION OF THE DRAWINGS

This and other objects and features of the present invention will be apparent from the following description with reference to the accompanying drawings, in which:

FIG. 2 is a fragmentary sectional view of the surface mounting type electronic device of FIG. 1;

FIG. 3 is an electric equivalent circuit diagram of the surface mounting type electronic device of FIG. 2;

DETAILED DESCRIPTION OF THE PREFERRED EMBODIMENTS

A surface mounting type ladder filter is described as an embodiment of the present invention with reference to the accompanying drawings.

Figure 1:
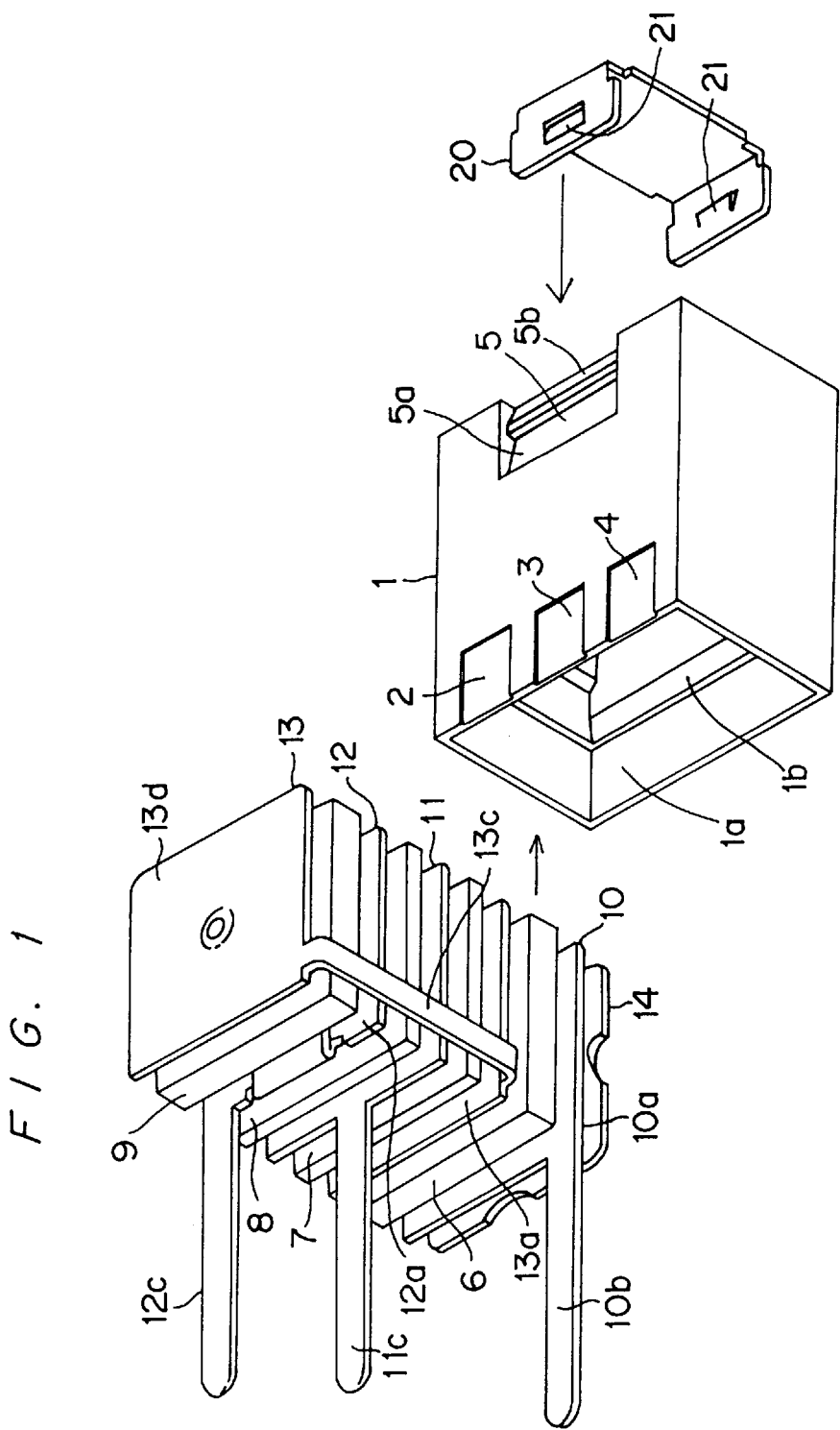
FIG. 1 is an exploded perspective view of a surface mounting type electronic device which is an embodiment of the present invention.

FIGS. 1 and 2 show the structure of the ladder filter. The ladder filter comprises a housing 1, four piezoresonators 6, 7, 8 and 9, an input terminal 10, a grounding terminal 11, an output terminal 12, a relay terminal 13, a spring 14 and a dummy metal member 20 for soldering. The piezoresonators 6 through 9 are of a conventional type which has oscillation electrodes on both sides.

The housing 1 has an opening 1a on one side. On the outer surface of the housing 1, recesses 2, 3 and 4 for positioning of the terminals 10, 11 and 12 and a recess 5 for positioning of the dummy metal member 20 are formed. In both end portions, the recess 5 has slopes with two steps 5a and 5b. The steps 5a and 5b have such configurations as to engage with claws 21 of the dummy metal member 20, which will be described in detail later. Further, the steps 5b also function as guides of the dummy metal member 20 to the recess 5. In the opening 1a, a slope 1b is made. The slope 1b is to facilitate insertion of a stack of the piezoresonators 6 through 9, the terminals 10 through 13 and the spring 14 into the housing 1.

The input terminal 10 has a contact portion 10a and an external connecting portion 10b, and a projection disposed on the contact portion 10a is in contact with the piezoresonator 6.

The grounding terminal 11 has a two-fold portion formed of contact portions 11a and 11b, and an external connecting portion 11c. A projection disposed on the contact portion 11a is in contact with the piezoresonator 8, and a projection disposed on the contact portion 11b is in contact with the piezoresonator 7.

The output terminal 12 has a two-fold portion formed of contact portions 12a and 12b, and an external connecting portion 12c. A projection disposed on the contact portion 12a is in contact with the piezoresonator 8, and a projection disposed on the contact portion 12b is in contact with the piezoresonator 9.

The relay terminal 13 has a two-fold portion formed of contact portions 13a and 13b, a contact portion 13d and a relay portion 13c. A projection disposed on the contact portion 13a is in contact with the piezoresonator 7, a projection disposed on the contact portion 13b is in contact with the piezoresonator 6, and a projection disposed on the contact portion 13d is in contact with the piezoresonator 9.

The piezoresonators 6 through 9, the terminals 10 through 13 and the spring 14 are contained in the housing 1. The spring 14 is disposed between a side wall of the housing 1 and the terminal 10 to cause an appropriate pressure among the piezoresonators 6 through 9 and the terminals 10 through 13. The opening 1a of the housing 1 has a step at the beginning of the slope 1b, and an insulating sheet 17 is set in the step. Then, the opening 1a is filled with a sealant 18 made of resin or the like.

The dummy metal member 20 is U-shaped and has claws 21 at both end portions as means for preventing the dummy metal member 20 from coming off the housing 1. The dummy metal member 20 is made by punching of a silver-plated phosphor bronze plate, a solder-plated iron plate, or the like. The dummy metal member 20 is fastened to the housing 1 by engaging the claws 21 with the steps 5a and 5b of the housing 1.

Now, a process of assembling the ladder filter of the above structure by use of an automatic assembly machine is described.

The piezoresonators 6 through 9 are oriented among the terminals and the spring 10 through 14, and in this state, these elements 6 through 14 are inserted in the housing 1 through the opening 1a. Even if the insertion of these elements 6 through 14 starts at a position slightly out of the regular position, the slope 1b guides these elements 6 through 14 to the correct position in the housing 1 smoothly.

In the meantime, the dummy metal member 20 is fastened to the recess 5 of the housing 1. As the dummy metal member 20 is being pushed toward the recess 5, the claws 21 are making elastic deformation by contact with the steps 5b of the recess 5. Thereby, even if the fastening of the dummy metal member 20 starts at a position slightly out of the regular position, the steps 5b guide the dummy metal member 20 to the correct position smoothly. Then, when the claws 21 have passed over the steps 5b and reached the steps 5a, the claws 21 return to the original shape because of their own elasticity, and the claws 21 engage with the steps 5a and 5b. Consequently, the dummy metal member 20 is securely fastened to the housing 1. Thus, without using adhesive, the dummy metal member 20 can be fixed to the housing 1.

Next, while the opening 1a, which the terminals 10 through 12 protrude the respective external connecting portions 10b, 11c and 12c from, is in the upper side, the opening 1a is filled with epoxy resin or the like. The epoxy resin is hardened into the sealant 18. Thereafter, the external connecting portions 10b, 11c and 12c of the terminals 10 through 12 are bent along the sides of the housing 1 (see FIG. 2), and thus, the ladder filter is finished as a surface mounting type.

The ladder filter assembled in this way, as shown in FIG. 2, is fixed on a printed circuit board 25 by solder 28. Specifically, the terminals 10 through 12 and the dummy metal member 20 are soldered to the corresponding conductors 26 on the circuit board 25.

FIG. 3 shows the electric equivalent circuit of the ladder filter. The piezoresonators 6 and 9 are connected in series between the input terminal 10 and the output terminal 12, the piezoresonators 7 and 8 are connected in parallel between the input terminal 10 and the output terminal 12.

Drop tests of the ladder filter were conducted. The samples subjected to the drop tests each have a dummy metal member 20 made of silver-plated phosphor bronze.

Figure 4:
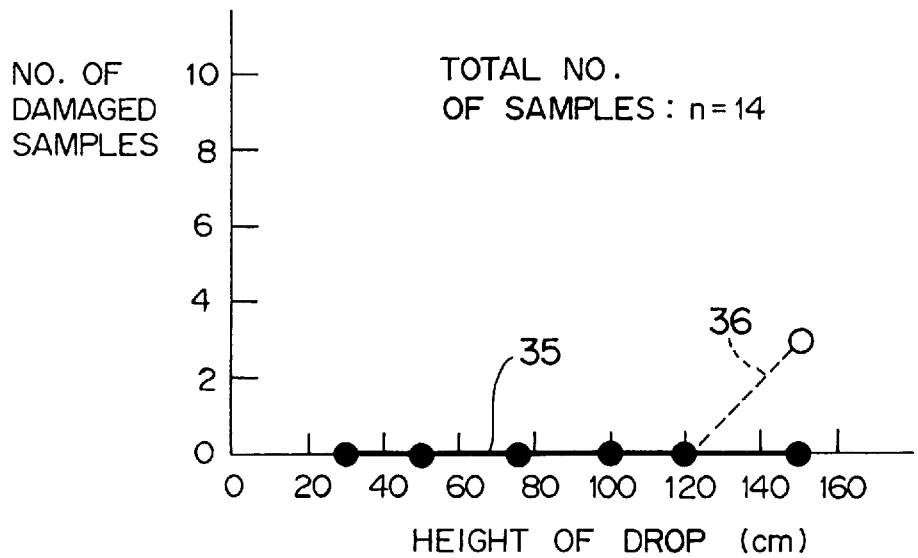
FIG. 4 is a graph showing the result of a drop test.
Figure 5:
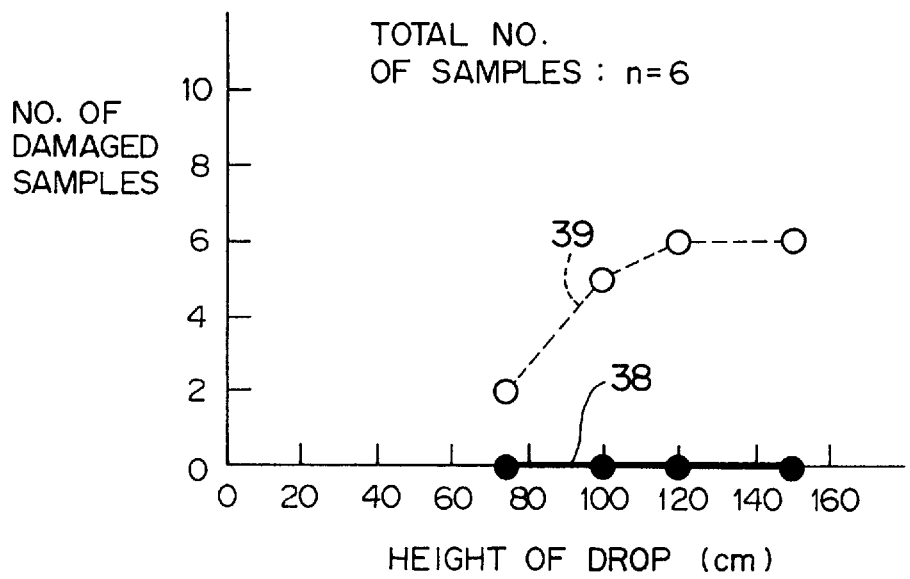
FIG. 5 is a graph showing the result of another drop test.

A first drop test was conducted in the following way. Each ladder filter was fixed on a printed circuit board by reflow soldering, and the ladder filter and the printed circuit board were dropped with the printed circuit board in a horizontal posture. The dropping was repeated ten times, and the ladder filter was examined. FIG. 4 shows the result (solid line 35). A second drop test was conducted in the following way. Each ladder filter was fixed to a falling jig, which is a weight of 130 g, by iron soldering. The falling jig was dropped in the direction of the longitudinal dimension (x direction) of the ladder filter, in the direction of the latitudinal dimension (y direction) of the ladder filter and in the direction of the thickness dimension (z direction) of the ladder filter, and in one cycle of dropping, the falling jig was dropped in the respective directions once. After ten cycles of dropping, the ladder filter was examined. FIG. 5 shows the result of the second drop test (solid line 38). Further, for comparison, ladder filters of a conventional type were subjected to the same tests, and the results were shown in FIGS. 4 and 5 by dashed lines 36 and 39). The conventional type has a dummy metal member which is made of solder-plated iron and fixed to the housing by adhesive.

As is apparent from the graphs of FIGS. 4 and 5, the samples of the present invention did not get damaged at all. As for the conventional type, more samples had damage, such as deformation and coming-off of the dummy metal member, as the height of dropping was increasing. As a result, it can be inferred that the ladder filter of the present invention has stronger fixation between the dummy metal member and the housing than conventional ladder filters.

The coming-off prevention means of the dummy metal member may have any configuration. For example, the coming-off prevention means may be hemispheric projections, and in this case, the housing should have hemispheric recesses to engage with the hemispheric projections.

The present invention is applicable not only to ladder filters but also to any other electronic devices such as oscillators and LC filters, as long as the electronic device has lead terminals which protrude their external connecting portions from one side of the housing. Further, it does not matter how many lead terminals are provided.

Although the present invention has been described in connection with the preferred embodiment, it is to be noted that various changes and modifications are possible to those who are skilled in the art. Such changes and modifications are to be understood as being within the scope of the present invention.

What is claimed is:

1. A surface mounting type electronic device comprising:
   a housing which contains electronic elements and having a bottom mounting surface, the housing having locking means on a first side thereof, said locking means having a two-step recess;
   a lead terminal having an external connecting portion which protrudes from a second side of the housing other than the first side having the locking means, the external connecting portion being bent so as to extend along said second side and along said mounting surface at a position for being soldered to a circuit board at said mounting surface; and
   a dummy metal member having two ends, the dummy metal member having coming-off prevention means at said ends; the dummy metal member being fixed to the housing by engaging the coming-off prevention means with the locking means, the dummy metal member being bent so as to extend at least along the second side and the mounting surface of the housing, one said end of said dummy metal member being at a position for being soldered to said circuit board at said mounting surface.

2. A surface mounting type electronic device as claimed in claim 1, wherein the dummy metal member is U-shaped and has claws at both end portions.

3. A surface mounting type electronic device as claimed in claim 2, wherein the claws have elasticity.

4. A surface mounting type electronic device as claimed in claim 1, wherein the dummy metal member is made of a silver-plated phosphor bronze plate.

5. A surface mounting type electronic device as claimed in claim 1, wherein the dummy metal member is made of a solder-plated iron plate.

6. A surface mounting type electronic device comprising:

a housing which contains electronic elements, the housing having locking means on one side;

a lead terminal having an external connecting portion which protrudes from a side of the housing other than to the side having the locking means; and a dummy metal member for soldering, the dummy metal member having coming-off prevention means;

wherein the dummy metal member is fixed to the housing by engaging the coming-off prevention means with the locking means, the locking means having a two-step recess.

7. A surface mounting type ladder filter comprising:

a substantially box-type housing having a bottom mounting surface, the housing having locking means on a first side thereof, said locking means having a two-star recess;

a piezoresonator contained in the housing;

a lead terminal which has a contact portion and an external connecting portion, the contact portion being contained in the housing and the external connecting portion protruding from a second side of the housing other than the first side having the locking means, the external connecting portion being bent so as to extend along said second side and along said mounting surface at a position for being soldered to a circuit board at said mounting surface; and a dummy metal member having two ends, the dummy metal member having coming-off prevention means at said ends; the dummy metal member being fixed to the housing by engaging the coming-off prevention means with the locking means, the dummy metal member being bent so as to extend at least along the second side and the mounting surface of the housing, one said end of said dummy metal member being at a position for being soldered to said circuit board at said mounting surface.

8. A surface mounting type ladder filter as claimed in claim 7, wherein the dummy metal member is U-shaped and has claws at both end portions.

9. A surface mounting type ladder filter as claimed in claim 8, wherein the claws have elasticity.

10. A surface mounting type ladder filter as claimed in claim 7, wherein the dummy metal member is made of a silver-plated phosphor bronze plate.

11. A surface mounting type ladder filter as claimed in claim 7, wherein the dummy metal member is made of a solder-plated iron plate.

12. A surface mounting type ladder filter comprising:

a substantially box-type housing, the housing having locking means on one side;

a piezoresonator contained in the housing;

a lead terminal which has a contact portion and an external connecting portion, the contact portion being contained in the housing and the external connecting portion protruding from a side of the housing other than to the side having the locking means; and a dummy metal member for soldering, the dummy metal member having coming-off prevention means;

wherein the dummy metal member is fixed to the housing by engaging the coming-off prevention means with the locking means, the locking means having a two-step recess.

13. A surface mounting type electronic device comprising:

a housing which contains electronic elements and having a bottom mounting surface, the housing having a first locking member on a first side thereof, said first locking member including a two-step recess formed in said housing;

a lead terminal having an external connecting portion which protrudes from a second side of the housing other than the first side having the first locking member, the external connecting portion being bent so as to extend along said second side and along said mounting surface at a position for being soldered to a circuit board at said mounting surface; and a dummy metal member having two ends, the dummy metal member being bent so as to extend at least along the second side and the mounting surface of the housing, the dummy metal member having a second locking member at each said end; the dummy metal member being fixed to the housing by engaging the second locking member with the first locking member, one said end of said dummy metal member at a position for being soldered to said circuit board at said mounting surface.

14. A surface mounting type electronic device as claimed in claim 13, wherein the dummy metal member is U-shaped and the second locking member comprises claws at both end portions thereof.

15. A surface mounting type electronic device as claimed in claim 14, wherein the claws have elasticity.

16. A surface mounting type electronic device as claimed in claim 14, wherein said housing has a pair of said first locking members which correspond respectively to said claws.

17. An assembly comprising: a surface mounting type electronic device as claimed in claim 13, further comprising a circuit board having conductors, said dummy metal member and said external connecting portion being soldered to respective said conductors on said circuit board at said mounting surface of the housing.

18. A surface mounting type electronic device comprising:

a housing which contains electronic elements, the housing having a first locking member on one side;

a lead terminal having an external connecting portion which protrudes from a side of the housing other than to the side having the first locking member; and a dummy metal member for soldering, the dummy metal member having a second locking member;

wherein the dummy metal member is fixed to the housing by engaging the second locking member with the first locking member, the first locking member including a two-step recess formed in said housing.

19. A surface mounting type ladder filter comprising:

a substantially box-type housing having a bottom mounting surface, the housing having a first locking member on a first side thereof, said first locking member including a two-step recess formed in-said housing;
a piezoresonator contained in the housing;
a lead terminal which has a contact portion and an external connecting portion, the contact portion being contained in the housing and the external connecting portion protruding from a second side of the housing on the than the first side having the first locking member, the external connecting portion being bent so as to extend along said second side and along said mounting surface at a position for being soldered to a circuit board at said mounting surface; and
a dummy metal member having two ends, the dummy metal member being bent so as to extend at least along the second side and the mounting surface of the housing, the dummy metal member having a second locking member at each said end thereof; the dummy metal member being fixed to the housing by engaging the second locking member with the first locking member, one said end of said dummy metal member being at a position for being soldered to said circuit board at said mounting surface.

20. A surface mounting type ladder filter as claimed in claim 19, wherein the dummy metal member is U-shaped and the second locking member comprises claws at both end portions thereof.

21. A surface mounting type ladder filter as claimed in claim 20, wherein the claws have elasticity.

22. An assembly comprising: a surface mounting type electronic device a claimed in claim 19, and further comprising a circuit board having conductors, said dummy metal member and said external connecting portion being soldered to respective said conductors on said circuit board at said mounting surface of the housing.

23. A surface mounting type ladder filter comprising:
a substantially box-type housing, the housing having a first locking member on one side;
a piezoresonator contained in the housing;
a lead terminal which has a contact portion and an external connecting portion, the contact portion being contained in the housing and the external connecting portion protruding from a side of the housing other than to the side having the first locking member; and
a dummy metal member for soldering, the dummy metal member having a second locking member;
wherein the dummy metal member is fixed to the housing by engaging the second locking member with the first locking member, the first locking member including a two-step recess formed in said housing.

24. An assembly comprising: a surface mounting type electronic device as claimed in claim 1, further comprising a circuit board having conductors, said dummy metal member and said external connecting portion being soldered to respective said conductors on said circuit board at said mounting surface of the housing.

25. An assembly comprising: a surface mounting type electronic device as claimed in claim 7, further comprising a circuit board having conductors, said dummy metal member and said external connecting portion being soldered to respective said conductors on said circuit board at said mounting surface of the housing.

26. A surface mounting type electronic device as claimed in claim 1, wherein said second side is opposite to said first side.

27. A surface mounting type electronic device as claimed in claim 7, wherein said second side is opposite to said first side.

28. A surface mounting type electronic device as claimed in claim 13, wherein said second side is opposite to said first side.

29. A surface mounting type electronic device as claimed in claim 19, wherein said second side is opposite to said first side.

30. A surface mounting type electronic device comprising:
a housing which contains electronic elements and having a bottom mounting surface, the housing having locking means on a first side thereof, said locking means having a two-step recess;
a lead terminal having an external connecting portion which protrudes from a second side of the housing other than the first side having the locking means, the external connecting portion being bent so as to extend along said second side and along said mounting surface at a position for being soldered to a circuit board at said mounting surface, the external connecting portion and the locking means of the housing being provided on the mounting surface; and
a dummy metal member having two ends, the dummy metal member having coming-off prevention means at said ends; the dummy metal member being fixed to the housing by engaging the coming-off prevention means with the locking means; the dummy metal member being bent so as to extend at least along the second side and the mounting surface of the housing, one said end of said dummy metal member being at a position for being soldered to said circuit board at said mounting surface.

31. A surface mounting type electronic device as claimed in claim 1, wherein an end of said external connecting portion of said lead terminal is provided on said bottom mounting surface.

32. A surface mounting type electronic device as claimed in claim 7, wherein an end of said external connecting portion of said lead terminal is provided on said bottom mounting surface.

33. A surface mounting type electronic device as claimed in claim 13, wherein an end of said external connecting portion of said lead terminal is provided on said bottom mounting surface.

34. A surface mounting type electronic device as claimed in claim 19, wherein an end of said external connecting portion of said lead terminal is provided on said bottom mounting surface.

35. A surface mounting type electronic device as claimed in claim 30, wherein an end of said external connecting portion of said lead terminal is provided on said bottom mounting surface.

36. A surface mounting type electronic device as claimed in claim 1, wherein
said end of said dummy metal member having said coming-off prevention means is at said position for being soldered; and
said end of said dummy metal member having said coming-off prevention means, as well as said external connecting portion of said lead terminal, are both provided on said bottom mounting surface.

37. A surface mounting type electronic device as claimed in claim 7, wherein
said end of said dummy metal member having said coming-off prevention means is at said position for being soldered; and
said end of said dummy metal member having said coming-off prevention means, as well as said external connecting portion of said lead terminal, are both provided on said bottom mounting surface.

38. A surface mounting type electronic device as claimed in claim 13, wherein said end of said dummy metal member having said second locking member is at said position for being soldered; and said end of said dummy metal member having said second locking member, as well as said external connecting portion of said lead terminal, are both provided on said bottom mounting surface.

39. A surface mounting type electronic device as claimed in claim 19, wherein said end of said dummy metal member having said second locking member is at said position for being soldered; and said end of said dummy metal member having said second locking member, as well as said external connecting portion of said lead terminal, are both provided on said bottom mounting surface.

\* \* \* \* \*